United States Patent
Kueck et al.

(10) Patent No.: US 6,644,117 B1
(45) Date of Patent: Nov. 11, 2003

(54) ELECTRO-MECHANICAL COMPONENT AND METHOD FOR PRODUCING THE SAME

(75) Inventors: Heinz Kueck, Stuttgart (DE); Metin Giousouf, Esslingen (DE)

(73) Assignee: Hahn-Schickard-Gesellschaft fuer Angewandte Forschung E.V., Villingen-Schwenningen (DE)

( * ) Notice: Subject to any disclaimer, the term of this patent is extended or adjusted under 35 U.S.C. 154(b) by 0 days.

(21) Appl. No.: 10/089,949

(22) PCT Filed: Oct. 6, 2000

(86) PCT No.: PCT/EP00/09813
§ 371 (c)(1),
(2), (4) Date: Aug. 8, 2002

(87) PCT Pub. No.: WO01/27025
PCT Pub. Date: Apr. 19, 2001

(30) Foreign Application Priority Data

Oct. 8, 1999 (DE) .......................................... 199 48 613

(51) Int. Cl.[7] .............................................. G01P 15/00
(52) U.S. Cl. .................. 73/488; 73/514.32; 73/514.35; 73/700; 73/862
(58) Field of Search .............................. 73/488, 514.01, 73/514.32, 514.35, 514.38, 700, 715, 718, 862, 862.381, 862.391, 862.46, 862.471, 862.473

(56) References Cited

U.S. PATENT DOCUMENTS

| | | | |
|---|---|---|---|
| 5,639,973 A | 6/1997 | Okada | |
| 5,725,363 A | 3/1998 | Bustgens et al. | |
| 5,836,750 A | 11/1998 | Cabuz | |

FOREIGN PATENT DOCUMENTS

| | | |
|---|---|---|
| DE | 4402119 A1 | 7/1995 |
| DE | 19719601 A1 | 11/1998 |
| DE | 19720482 A1 | 11/1998 |

*Primary Examiner*—Richard A. Moller
(74) *Attorney, Agent, or Firm*—Glenn Patent Group; Michael A. Glenn (57) ABSTRACT

An electromechanical component consists of a polymeric body comprising a mechanically active part with a spring and a frame, and of a metal layer which encompasses the spring substantially completely so as to mechanically stabilize the same. The electromechanical component can be an acceleration sensor, a rotary speed sensor, a microvalve, a micropump, a pressure sensor, or a force sensor. Production of said electromechanical component incurs drastically reduced costs compared to electromechanical components produced using silicon-based technology because simple injection-moulding and/or embossing processes, instead of the complicated silicon-based technology, can be used for producing said electromechanical component.

36 Claims, 7 Drawing Sheets

ELECTRO-MECHANICAL COMPONENT AND METHOD FOR PRODUCING THE SAME

FIELD OF THE INVENTION

The present invention refers to microstructure technology and especially to electromechanical components.

BACKGROUND OF THE INVENTION AND PRIOR ART

Electromechanical components are components which electrically detect or electrically cause a mechanical effect. Examples of electromechanical components are sensors for linear accelerations, rotary speed sensors, force sensors, pressure sensors and also microvalves or micropumps.

Acceleration sensors, for example, i.e. sensors for detecting a linear acceleration, or rotary speed sensors for detecting an angular acceleration, normally include a movable mass which is connected to a fixed frame through at least one spring beam. When an acceleration sensor is subjected to an acceleration, the spring beam will deform elastically and the mass will be deflected. This deflection can then be detected making use of a large number of known methods, such a capacitive, inductive, optical etc. methods.

Microvalves, however, normally have a movable, elastic structure which, in response to the application of a suitable electric signal, will reduce or enlarge the size of a flow path for a fluid, i.e. which will cause as a mechanical effect a limitation of the amount of fluid flowing through.

Micropumps are, however, normally provided with a diaphragm which is elastic or elastically suspended so as to change a volume. A micropump will normally also be provided with valves so as to achieve via said change in volume a conveyance of a defined amount of fluid. It follows that the mechanical effect in the case of micropumps is transport and dosage of a fluid.

Pressure sensors or force sensors may also be provided with an elastically deformable diaphragm, which is elastically deformed, i.e. "deflected", to a certain degree in response to a specific pressure; just as in the case of the acceleration sensor, this deflection can be detected in various ways so as to obtain an electric signal indicative of the pressure applied. All the above-mentioned electromechanical components comprise an active part, which is elastically deformed by the outer mechanical effect or the elastic deformation of which leads to the mechanical effect.

Such electromechanical components can comprise an integrated means for converting the mechanical effect into an electric effect or for converting an electric effect into a mechanical effect. Only by way of example, the known electrode structure, e.g. in the form of fingers or in the form of a diaphragm, should here be mentioned; this electrode structure comprises a first group of electrodes connected to a movable part, and a second group of electrodes connected to a fixed part relative to which the movable part moves. The two groups of electrodes are arranged in an interleaving mode of arrangement in such a way that a deflection of the movable part relative to the fixed part results in a change in the distances between the electrodes, said change leading to a change in the capacitance of the electrode arrangement. This change in capacitance is e.g. a function of the acceleration acting on the movable part. In the case of a pressure sensor, the mechanical effect can be caused e.g. by a change in the distance between two planar electrodes in the sense of a plate capacitor. This change in capacitance can be measured making use of an alternating voltage.

Electromechanical components of this type are normally produced from silicon material in miniaturized form making use of the silicon-based technology which proved to be efficient in wafer processing. Silicon-based technology permits mass production which resulted in a wide range of use of e.g. capacitive acceleration sensors which have been produced using silicon-based technology; such acceleration sensors are in particular used in the field of automotive engineering, where acceleration sensors for airbag systems should especially be mentioned.

In the case of such silicon sensors, the inertial mass is suspended from thin springs and provided with electrode structures defining together with fixed similar electrode structures a capacitor whose capacitance changes in the case of acceleration, whereby the acceleration can be detected electronically. Silicon acceleration sensors are produced e.g. in polysilicon surface mechanics by the firm of Bosch in Reutlingen. In the case of this technology a wafer with sensor chips is produced and subsequently connected, e.g. by means of the anodic bonding method, to a cover wafer which has been prefabricated in a suitable manner again by means of silicon-based micromechanical techniques, so that the sensitive micromechanically patterned silicon sensor structures will be protected. Subsequently, the composite wafer with the encapsulated sensor chips is diced. The individual sensor chips are then installed together with an electronic chip in a suitable housing making use of standard methods in the field of microelectronical technology so as to obtain the finished sensor system. The sensor systems can then be further processed like purely electronic components.

Advantages of these silicon acceleration sensors are the small physical size of the sensor and, consequently, of the chip, the fact that they can be produced in batch production processes as well as the high long-term stability and the accuracy in view of the advantageous properties of the silicon material used.

One disadvantage of such systems is the fact that, due to the very small dimensions of their sensor structures, when e.g. electrode structures are intended to be used as groups of fingers, and in view of the so-called sticking effect, it is necessary to protect such sensors against particles and moisture by a virtually hermetic seal. Another disadvantage is that, in spite of batch production and the build-up technique used in the field of electronics technology, the manufacturing process in its entirety is still very expensive, since, in addition to the electronic chip, also two silicon wafers must be produced, connected and diced by micromechanical methods.

Although silicon-based technology has gained great acceptance, which resulted in more moderate prices for the whole clean room systems and which has already led to a high degree of automation, it should still be pointed out that a complete clean room as well as adequately trained staff are necessary for wafer processing. It follows that a decisive cost factor is not the material itself, but the production outlay, which is essentially determined by the systems required and the labour costs incurred.

DE 44 02 119 A1 discloses a micro-diaphragm pump, the diaphragm being produced from titanium and the valves from polyimide. Alternatively, the diaphragm may consist of polyimide having a heating coil applied thereto.

U.S. Pat. No. 5,836,750 discloses an electrostatically driven mesopump comprising a plurality of unit cells. A pump diaphragm can be produced from metal-coated polymers, from metal or from a conductive flexible elastic polymer.

DE 197 20 482 A1 discloses a micro-diaphragm pump having a diaphragm which consists of PC or PFA. A piezo-actor can be provided on a brass sheet which is, in turn, applied to the pump diaphragm.

SUMMARY OF THE INVENTION

It is the object of the present invention to provide less expensive electromechanical components and methods for producing the same, which still have mechanical and electrical properties comparable to those of silicon components.

In accordance with a first aspect of the present invention, this object is achieved by an electromechanical component comprising: a polymeric body including a mechanically active part and a frame; and a metal layer which covers the mechanically active part at least partially so as to mechanically stabilize the same, said mechanically active part including a spring beamconnecting the frame to a mass which moves when said spring beam bends; and said metal layer encompassing the spring beam substantially completely, with the exception of the locations where said spring beam is connected to the frame and the mass, so as to mechanically reinforce said spring beam In accordance with a second aspect of the present invention, this object is achieved by a method for producing an electromechanical component comprising the steps of: forming a polymeric body including a mechanically active part and a frame, said mechanically active part including a spring beam connecting the frame to a mass which moves when said spring beam bends; and forming a metal layer covering the mechanically active part at least partially so as to mechanically stabilize the same, in such a way that the metal layer encompasses the spring beam substantially completely, with the exception of the locations where said spring beam is connected to the frame and the mass, so as to mechanically reinforce said spring beam.

The present invention is based on the finding that for producing electromechanical components at a really moderate price, it will be necessary to take leave of the established silicon-based technology. In accordance with the present invention, a polymer material is used as a starting material; making use of e.g. injection-moulding and/or embossing (stamping) technique(s), which has/have gained widespread acceptance as well, this polymer material can be processed such that almost arbitrary shapes and structures are obtained. In addition, polymer materials are normally very moderate in price. The decisive advantage, however, resides in the manufacturing technique. The machinery required for processing polymers is much less complicated and, consequently, much less expensive than the respective machinery used in the field of silicon-based technology. Depending on the respective composition, also polymer materials have elastic properties which can be used for producing spring beams having defined deflection properties.

Polymer materials are, however, problematic insofar as plastic materials of this kind have flow properties leading to serious problems with regard to the long-term stability, unless precautionary measures are taken. According to the present invention, this problem is solved in that mechanically active parts of the polymeric body of the electromechanical component are provided with a metal layer. A plastic/metal composite system is produced in this way, which can achieve properties that are almost as good as those of a component consisting completely of metal or of silicon. This is due to the fact that the outer metal surfaces have a stronger influence on the mechanical parameters, such as the stiffness and the areal moment of inertia, than the plastic core. For the metal layer itself, gold can be used by way of example. For reducing the costs still further, a metal layer consisting of nickel, copper etc. may, however, be used as well. The mechanically active parts of the acceleration sensor described are the spring beams through which the seismic mass is suspended from the fixed frame. In the case of electromechanical components having diaphragms, the mechanically active part also includes the diaphragm which is elastically deformable and which, due to the flow properties of the plastic material, would have an insufficient long-term stability if it were not provided with a metal layer.

In accordance with a particularly preferred embodiment, the electromechanical component consists of a two-component polymeric body comprising a first part consisting of a first polymer material which is adapted to be metallized in a wet-chemical process, and a second part consisting of a second polymer material which is not adapted to be metallized in a wet-chemical process. The necessary metallizations can be defined in this way by a double-shot injection moulding process, i.e. the metallization of the mechanically active parts which serves to improve the mechanical stability of these parts and also the metallizations which are necessary for converting the mechanical effect into an electric signal, such as finger structures, capacitor plates, and also the necessary conducting tracks of the electromechanical component leading to an internal electronic circuit, which is inserted in or secured in position on the polymeric body in a hybrid way, or to an outer plug.

The essential advantage of the method according to the present invention is an extreme reduction of costs in comparison with electromechanical components which have been produced making use of silicon-based technology.

The minimum structural sizes which can nowadays be achieved by processing plastic materials are, at least at present, still substantially larger than the sizes that can be achieved by silicon-based micromechanics. This will impair primarily the dimensions of the springs and the distances between capacitor electrodes. In order to minimize the electric noise of the sensor system, a minimum capacitance must be obtained; in the case of silicon-based technology this must be achieved through very small distances between the electrodes. In accordance with the method according to the present invention, however, this need not be purchased at the cost of an ever increasing miniaturization and the problems entailed thereby, but it can be obtained by increasing the physical sizes, since materials which are much less expensive than silicon are used and since the preferred injection moulding process does not involve any substantial limitations of the height of e.g. oscillating masses, whereas the use of polysilicon definitely leads to such limitations.

On the other hand, the moulding/machining technique using polymer materials has, as is generally known, also the potential for a production of structures which may also have sizes in the micrometer range. For this purpose, the injection moulding process is preferably combined with an injection/embossing process or with the known hot-embossing process.

The larger physical shape and physical size of the electromechanical component according to the present invention entails the advantage of a reduced sensitivity to particles and contamination. In addition, the whole metallized surface may be covered with a dense, thin gold layer so as to increase the robustness and so as to make the sensor system less sensitive to humidity and environmental influences so that the demands which have to be satisfied by an encapsulation will be much lower than those in the case of silicon components.

The method used for forming the metal layers is preferably the method of chemical metallization without making use of external current. This method may, advantageously, be combined with the method of reinforcing the metal layers by electroplating; by controlling the metal thickness in the case of a reinforcement by electroplating, the electrode distance for the electrode structures as well as the natural frequency of the sensor element can be controlled precisely and optimized for the relevant field of use. By controlling the amount of metal that is grown, the method according to the present invention also provides the possibility of determining very precisely the mass of the movable, inertial structure in the case of an acceleration sensor or the mass and also the modulus of elasticity of a diaphragm in the case of microvalves and micropumps, respectively. In addition, it is possible to increase the seismic mass in the case of inertial sensors by encompassing an inserted metal body with polymer material by injection moulding.

Finally, the whole range of possibilities of injection moulding technology is provided, e.g. the use of alignment pins/holes and of snap connections for establishing non-releasable connections or the use of sealing edges which, by means of injection moulding, are formed integrally with the component to be sealed and/or the use of externally inserted rubber gaskets; these possibilities are extremely economy-priced in comparison with silicon-based technology and almost the same effect can be achieved by them.

Last but not least, the production process comprises a small number of steps in comparison with silicon-based technology, whereby the reject rate in the production process and, consequently, also the costs can be kept low.

BRIEF DESCRIPTION OF THE DRAWINGS

In the following, preferred embodiments of the present invention will be explained in detail making reference to the drawings enclosed, in which.

DETAILED DESCRIPTION OF PREFERRED EMBODIMENTS

Figure 1:
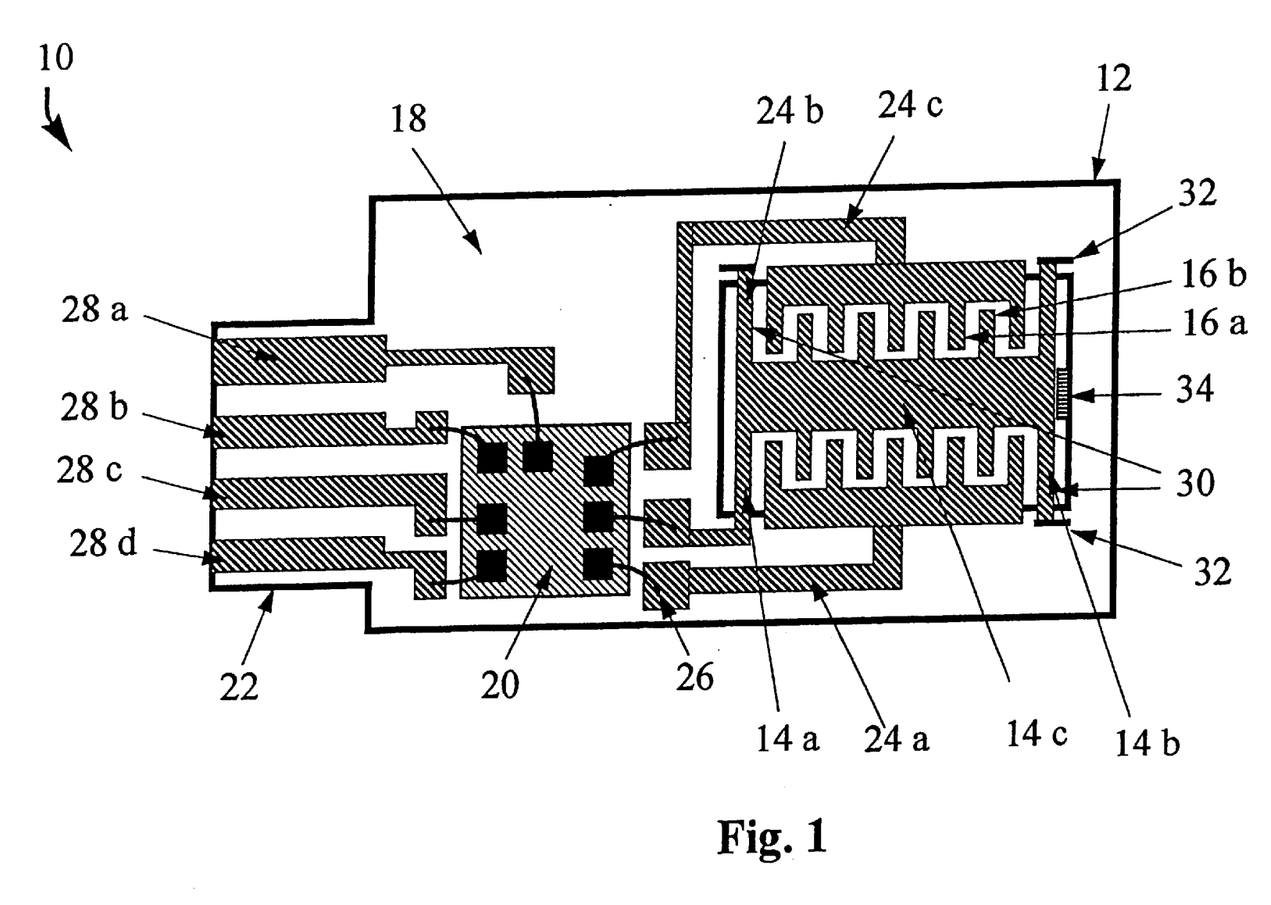
FIG. 1 shows a schematic top view of the electromechanical component according to the present invention.

FIG. 1 shows an electromechanical component designated generally by reference numeral 10. The electromechanical component 10 is provided with a polymeric body 12 having a mechanically active component including the two spring beams 14a, 14b as well as a seismic mass 14c. The electromechanical component 10 shown in FIG. 1 is a sensor for measuring a mechanical acceleration. The acceleration sensor shown in FIG. 1 uses, by way of example, the capacitive detection principle comprising an electrode structure including a first group of electrodes 16a, which are attached to a fixed frame 18, and a second group of electrodes 16b having fingers which are secured to the seismic mass 14c. The electromechanical component 10, which is shown in the form of an acceleration sensor in FIG. 1, additionally includes some kind of electronic circuit (chip) 20 as well as a connecting plug 22, which also represents part of the polymeric body 12, i.e. the connecting plug 22 and the fixed frame as well as the mechanically active part all consist of polymeric material. For activating and reading the electrode structure 16a, 16b the electromechanical component additionally includes conducting tracks 24a to 24c connecting the movable mass as well as the two first groups of electrodes 16a of the finger structures via bonding wires 26 to the chip, i.e. the respective connecting areas of the chip. The electromechanical component 10 additionally comprises further conducting tracks 28a to 28d which, on the one hand, are also connected to the chip 20 via bonding wires and which, on the other hand, terminate in ends of increased width so as to form with the polymeric body 12 a connecting plug having four contacts in the embodiment shown in FIG. 1.

When the electromechanical component 10 is subjected to linear acceleration, the seismic (inertial) mass 14c is deflected relative to the fixed frame 18, and this leads to an elastic deformation of the spring beams 14a, 14b. The displacement of the mass 14c leads to a changed capacitance which can be detected making use of the first and second groups of fingers 16a, 16b and which can already be processed "in situ" in the IC 20 so as to be outputted via the plug area 22.

As has already been mentioned, the long-term stability of such an electromechanical component would not be particularly high, since polymer materials normally have a flow behaviour which changes with time. In other words, the constant deformation of the two spring beams 14a, 14b will cause also a plastic deformation in addition to the elastic deformation in the course of time, whereby the sensor would lose sensitivity in the course of time and finally become useless. According to the present invention this problem is solved by providing a metal layer 30 covering, at least partially, the mechanically active part so as to mechanically stabilize the same. In the embodiment shown in FIG. 1, the mechanically active part comprises the springs 14a, 14b as well as the seismic mass 14c. For obtaining the stabilization according to the present invention, i.e. so as to achieve a good long-term stability without which the use of polymer materials for such electromechanical components would not be possible at all, the spring beams are provided with the metal layer. It is, however, not absolutely necessary to metallize also the seismic mass 14c for reasons of mechanical stabilization. In the present case this is, however, done in view of the capacitive detection principle. If the detection principle used is not a capacitive principle, but some other kind of detection principle, which does not necessitate contacting of the movable mass 14c, it would suffice to metallize the spring beams 14a, 14b so as to decisively improve their mechanical properties.

A further advantage of the present invention is to be seen in the fact that the metallic layers, which are provided for the purpose of stabilization and which are preferably implemented such that they encompass the beams not only partially but fully, may simultaneously be used for conducting electric signals. This will also increase the resonant frequency of the system, and this is important in the case of acceleration sensors, by way of example.

In principle, the polymeric body 12 may consist of only one polymer material; in this case, the patterning of the capacitive detection electrodes and of the spring beams would be carried out making use of e.g. a single-shot injection moulding process, whereupon the metallization pattern shown in FIG. 1, i.e. the metal layers on the mechanically active part used for the purpose of stabilization and the additional metal layers used for forming the conducting tracks, would be produced, e.g. by vapour-phase coating, making use of a shadow mask.

It is, however, preferred to use a double-shot injection moulding process in which the areas which are to be metallized later on are produced in a first shot making use of a polymer material which is adapted to be metallized in a wet-chemical process, whereupon the fixed frame is injection moulded in a second shot around the result of the first shot. This two-component injection moulding technology is advantageous insofar as the patterning of the metallization is obtained so to speak automatically when the result of the second shot is metallized in a wet-chemical process, since a metal layer will only be formed on the surfaces consisting of the first polymer material, which is metallizable, whereas no deposition of metal will take place on the other surfaces consisting of the second polymer material, which is not adapted to be metallized in a wet-chemical process.

The metallized part of the polymeric body adheres to the non-metallized part per se, due to the injection moulding process. In order to improve the connections, since mechanical forces may perhaps act on the polymeric body at least in the area of the springs, positive-locking anchoring means 32 are, however, preferably provided, which have the effect that the two polymeric parts made of the different polymer materials will not only adhere to one another, but will mechanically be interconnected in positive engagement with one another. Anchoring structures which are suitable for this purpose are anchoring structures of arbitrary shape which are compatible with the production process comprising at least two stages.

As can be seen in FIG. 1, the IC 20 need not be provided in the form of a housed chip, but it may also be provided in the form of a bare chip having suitable connecting areas which are adapted to be contacted via bonding wires 26.

Figure 2:
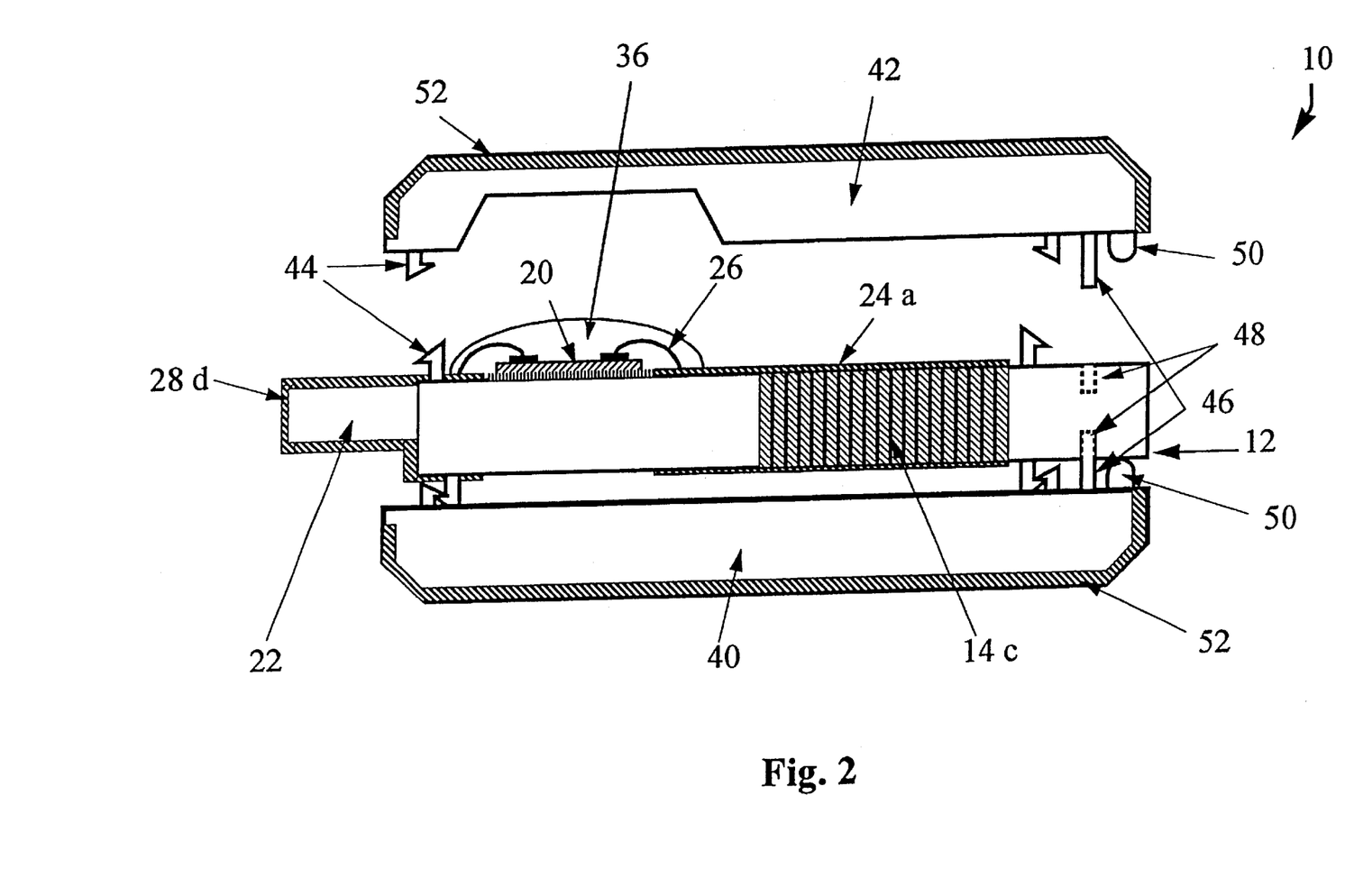
FIG. 2 shows a schematic side view of the electromechanical component having a housing base and a housing cover according to a preferred embodiment of the present invention.

In the following, the preferred production method, in which two different polymer materials for the two injection-moulding shots are used, will be discussed in detail. The springs 14a, 14b, the seismic mass 14c, the electrodes 16a, 16b and, firstly, the conducting track areas 24a to 24c as well as, secondly, the conducting track areas 28a to 28d extending into the plug area 22 are produced in the first shot from a suitable metallizable first polymer material, e.g. from Pd-doped LCP (LCP=Liquid Crystal Polymer, e.g. Vectra E 820 i produced by the firm of Hoechst) or polyamide (PA) 66. The residual part of the fixed frame, the insulation areas and other features, such as the snap-type connectors, which will be discussed making reference to FIG. 2, are, however, produced from the second polymer material in the second shot; in the subsequently employed metallization process, this second polymer material will not accept any metal. Such a material is e.g. undoped LCP or PA 66. As far as the structural design of the mould is concerned, it may perhaps also be advantageous to reverse the sequence in the injection moulding process, i.e. to injection-mould first the structures which are not to be metallized and then the structures which are to be metallized.

The two-component injection-moulded parts are then treated in a sequence of wet-chemical processing steps in such a way that a metal layer will autocatalytically deposit on the surface of the first polymer material. The most important operating steps consist of the steps of cleaning the injection-moulded parts, tempering the injection-moulded parts and sensitizing the surface thereof by a surface reaction, such as mild etching of the surface or causing the surface to swell and seeding it with Pd seeds.

Subsequently, the injection-moulded parts are coated with metal in an autocatalytic bath. Suitable materials for the layers are copper or nickel as start layer, conductor layer and layer used for the purpose of mechanical stabilization, and gold as a surface protection layer which is adapted to be soldered and wire-bonded. Typical metal layer thicknesses are thicknesses in the order of 30 $\mu$m, the thickness being, however, limited by layer stresses and the adhesion of the layer to the polymer material and, of course, especially by the deposition period.

The layer thickness is therefore preferably increased by a galvanic layer, e.g. nickel, prior to the gold-plating step. Whereas metal layers deposited without making use of external current are characterized by a very high conformity of the layers, galvanic layers with fine pattern details tend to have strongly inhomogeneous layer thicknesses which may have a negative effect on the geometry of the components, in particular on the distances between the electrodes or on the springs and their elastic properties.

Due to the symmetry of the structure, the fixed metallized areas in the form of the electrodes 16a can be used as auxiliary electrodes in accordance with a preferred production method of the present invention so as to achieve, by the application of a suitable potential, a more homogeneous deposition on the spring beams and also on the seismic mass. In the course of this process, metal does not deposit on the auxiliary electrode. For electrodeposition, electric contacting of the respective areas is necessary. When the voltage is being applied, an attractive force will act on the sensor structure, but, due to the symmetry of the structure in its entirety, this attractive force will be compensated for.

In order to reliably prevent the first group of electrodes 16a and the second group of electrodes 16b from coming into contact with one another when an electric voltage is being applied, and for unsymmetric structures in the case of which the attractive forces do not compensate each other, an auxiliary connection 34 consisting of the first or the second polymer material can be used. The auxiliary connection will then be removed, e.g. by punching out, after the end of the metallization process, when potential differences are no longer applied to the comb structure.

An additional parameter that has to be taken into account in the case of the preferred embodiment of the present invention in which the polymeric body consists of two polymer materials is the bonding strength between the various polymer materials. When two LCP materials are bonded in a two-component injection moulding process without any additional measures being taken, an adhesive strength is obtained which may be perhaps too low. The anchoring means 32, which have already been described, will therefore be used in order to improve the adhesive strength between the areas of different polymer materials; in particular, these anchoring means 32 are advantageously positioned such that they are located at the points where the highest mechanical loads occur, i.e. in the area where the springs are connected to the fixed frame, by way of example.

After the production and the metallization of the injection-moulded part, the electromechanical component will be equipped with the electronic circuit 20. For electric contacting, various measures can be taken, which will be discussed in detail in the figures following hereinbelow.

FIG. 2 shows a side view of the electromechanical component 10; just as in FIG. 1, bond connections via bonding wires 26 were used for contacting the chip 20 in FIG. 2. For increasing the robustness, an encapsulating material 36 is applied on top of the area in which the chip 20 and the bonding wires 26 are located. FIG. 2 additionally shows how the external conducting tracks are implemented, taking the conducting track 28d in the plug area as an example; this conducting track 28d is implemented such that it extends around the plug area 22. FIG. 2 additionally shows that the electromechanical component is encapsulated making use of a housing base 40 and a housing cover 42 so as to protect it against outer influences. For connecting the polymeric body 12 to the housing base 40 as well as the housing cover 42, snap connections, which are known in the field of plastic engineering and which comprise a respective first snap hook on one component and a respective matching snap hook on the other component, are provided; these snap connections are designated generally by reference numeral 44. For aligning the two components, alignment pins 46, which are adapted to be introduced into complementary alignment holes 48, are additionally provided on the housing base 40 as well as on the housing cover 42. For sealing the mechanically active part, circumferentially extending sealing means, which are designated by reference numeral 50, are additionally provided on the housing cover as well as on the housing base. These sealing means can either be realized by the use of rubber rings or by sealing edges formed integrally with the housing cover and the housing base by means of injection moulding, since also the housing base as well as the housing cover consist preferably of the polymer material, and in the case of the two-component embodiment at least partially of the polymer material that is metallizable so as to achieve a metallization on the outer surface of the housing base as well as on the outer surface of the housing cover, which is designated by reference numeral 52, for guaranteeing electromagnetic screening, whereby the noise as well as the sensitivity of the whole electromechanical component can be improved.

Alternatively to connecting the polymeric body to the housing cover 42 and the housing base 40 making use of the snap connectors 44, a suitable adhesive or a welding method can be used. Suitable welding methods are ultrasonic welding or laser welding, in particular welding by means of diode lasers. As has already been mentioned, the arrangement of guide pins 46 and guide holes 48 can be used for adjusting the housing cover 42 and the housing base 40 so as to simplify the joining process.

Alternatively to constructing the electromechanical component making use of the polymeric body, the housing base 40 and the housing cover 42, i.e. alternatively to constructing the electromechanical component from three components, the sensor element is closed from only one side with a housing cover in accordance with a preferred embodiment, whereas the other side is already closed during the production process of the polymeric body. In other words, the housing base is formed simultaneously with the formation of the polymeric body; this can easily be achieved by a suitable mould.

The housing cover must, however, be implemented such that it can be attached subsequently so that the electromechanical component can be equipped with the chip 20. However, when an electromechanical component having already inserted therein a chip is dispensed with, i.e. when the connecting areas of the conducting tracks 24a to 24c (FIG. 1) are "extended" up to the plug area 22, it will, in principle, also be possible to form the whole electromechanical component at one go making use of a suitable mould, since, in contrast to the known silicon-based technologies, the surfaces to be metallized need not be accessible from above when the wet-chemical metallization process in a catalytic bath is used, since the autocatalytic bath enters the cavities and leads to a deposition of metal wherever the material which is adapted to have metal applied thereto making use of the wet-chemical process is present as a polymer material.

In order to provide a higher geometric accuracy of the mechanically active part of the polymeric body, i.e. of the spring beams 14a, 14b and of the movable mass 14c in the case of the acceleration sensor, an injection/embossing (injection/stamping) process or a hot-embossing (hot-stamping) process can be used instead of the injection moulding process; the resultant embossed (stamped) parts are then encompassed with polymer material by injection moulding so as to form the finished polymeric body in which the mechanically active part and, in cases in which capacitive evaluation is used, also the second group of electrodes, i.e. the fixed fingers attached to the frame 18, have an even more precisely defined geometrical shape. Both the injection/embossing process and the hot-embossing process permit a very high structural fineness and, in particular, little distortion of the individual elements; this distortion may occur due to orientation effects of the polymers when an injection moulding process alone is used.

In order to avoid problems which will occur due to sticking or adhesion between the mechanically active part and the frame during production and also during operation, recesses are preferably formed on the mechanically active part or on the frame so as to define spacers which prevent the mechanically active part from sticking to the frame in the case of movement or contact.

Figure 3:
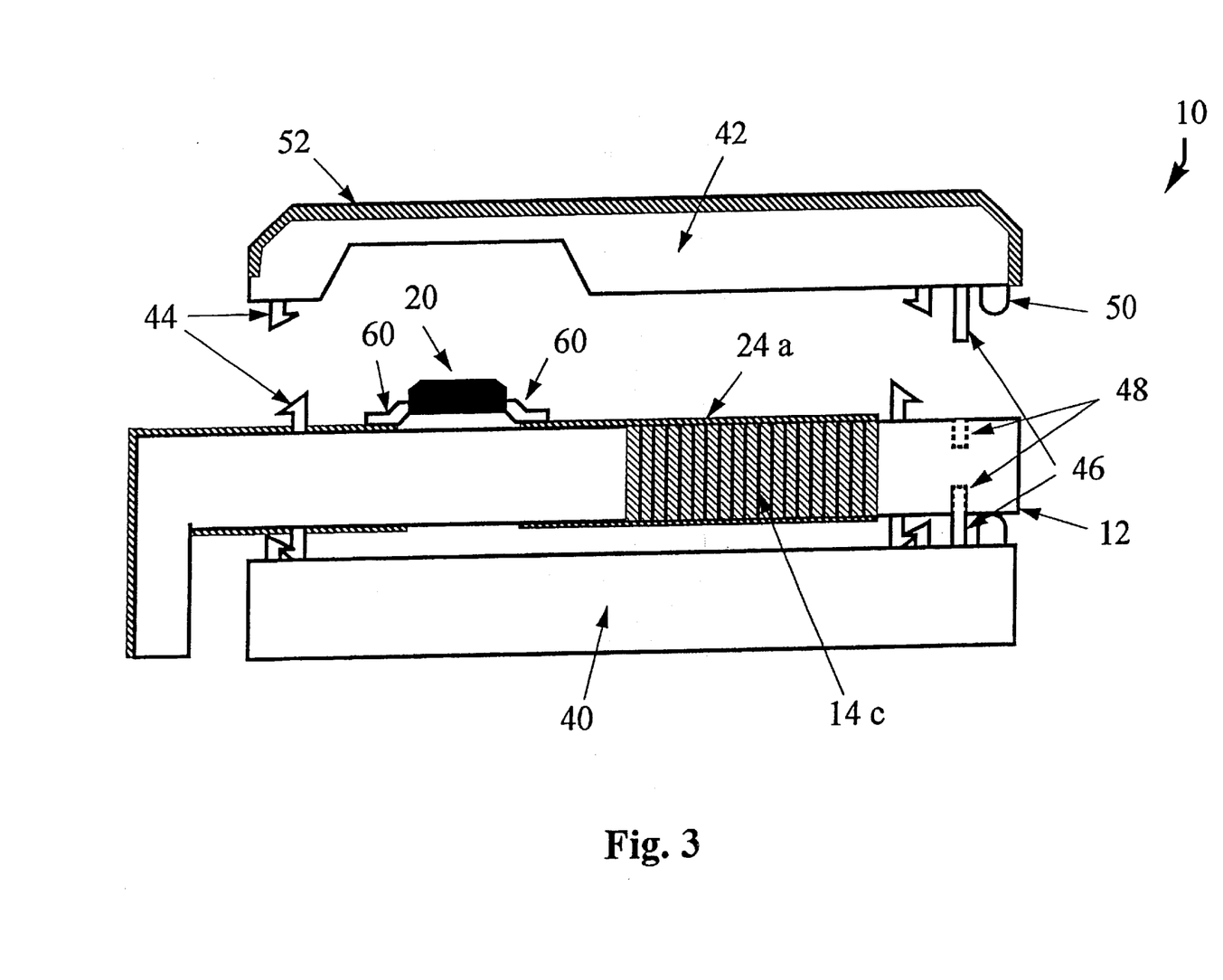
FIG. 3 shows a side view of the electromechanical component in combination with an SMD component for electric activation and/or evaluation.

In FIG. 3 to 6 following hereinbelow, additionally possibilities are described for contacting the chip 20 on the metallized polymeric body 12. As can be seen in FIG. 3, the chip 20 need not necessarily be provided in the form of a so-called bare chip, but it may also be provided in the form of an SMD component (SMD=Surface Mount Device), i.e. a housed component which is provided with connections 60, the connections 60 being attached to the connecting areas of the conducting tracks 24a to 24c and 28a to 28d (FIG. 1) and being then either joined to the connecting areas by a conductive adhesive or, preferably, soldered thereto. The use of SMD components which are easy to handle and which, due to mass production, are simultaneously available in high numbers of pieces with standardized dimensions is possible due to the fact that, in comparison with silicon sensors, a great height and width of the electromechanical polymer components can be achieved. The electromechanical component itself may also be implemented as an SMD component instead of being provided with a plug connection for the purpose of contacting.

Figure 4:
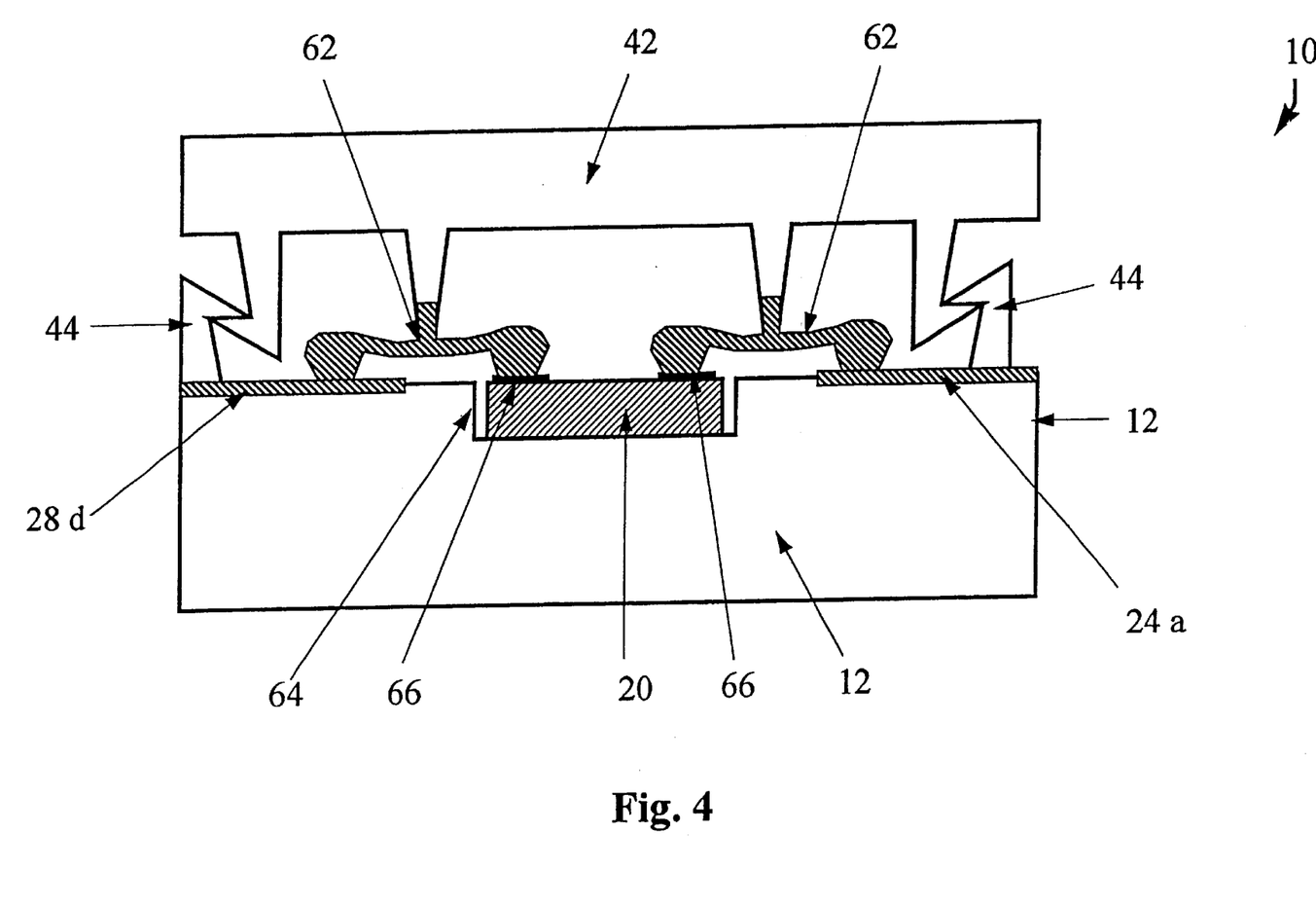
FIG. 4 shows a side view of the electromechanical component with spring contacts for contacting an electronic circuit.

Another advantageous variant of contacting the electric circuit, which is now again provided in the form of a bare chip 20, is shown in FIG. 4. In the case of this variant, the chip 20 is not contacted by soldering, glueing, bonding or the like, but only by spring force making use of metallized spring contacts 62. In order to obtain a simpler structural design of the spring contacts 62, a recess 64 is provided in the polymeric body 12 in the case of this embodiment of the present invention; this recess can easily be obtained when a suitable injection mould is used. Preferably, the recess is dimensioned such that the surface of the chip 20 is essentially flush with the surface of the polymeric body 12, as can be seen in FIG. 4. Subsequently, the chip is placed in the recess and, if necessary, slightly fixed in position so that it will not be displaced when the cover 42 is being attached. When the cover is being attached and when the cover and the polymeric body 12 are pressed together, the snap connectors 44 will snap into place sooner or later. The spring contacts 62 are dimensioned such that, when the snap connections 44 snap into place, they will apply pressure to the connecting areas 66 of the chip 20 as well as to the complementary connecting areas of the conducting tracks to be contacted, e.g. 24a, 28d, in such a way that a simple and especially releasable contact connection is achieved. As can clearly be seen from the hatched areas of the spring contacts 62 in FIG. 4, the lower portions of these spring contacts 62 are metallized so as to actually permit an electric contact between the chip and the conducting track. Just as the metallized areas of the polymeric body 12, the metallized spring contacts 62 can be produced by injection moulding from the polymer material which is metallizable by a wet-chemical process. In cases in which only a single polymer material is used, the spring contacts may also be rendered conductive making use of a shadow mask etc.

Figure 5:
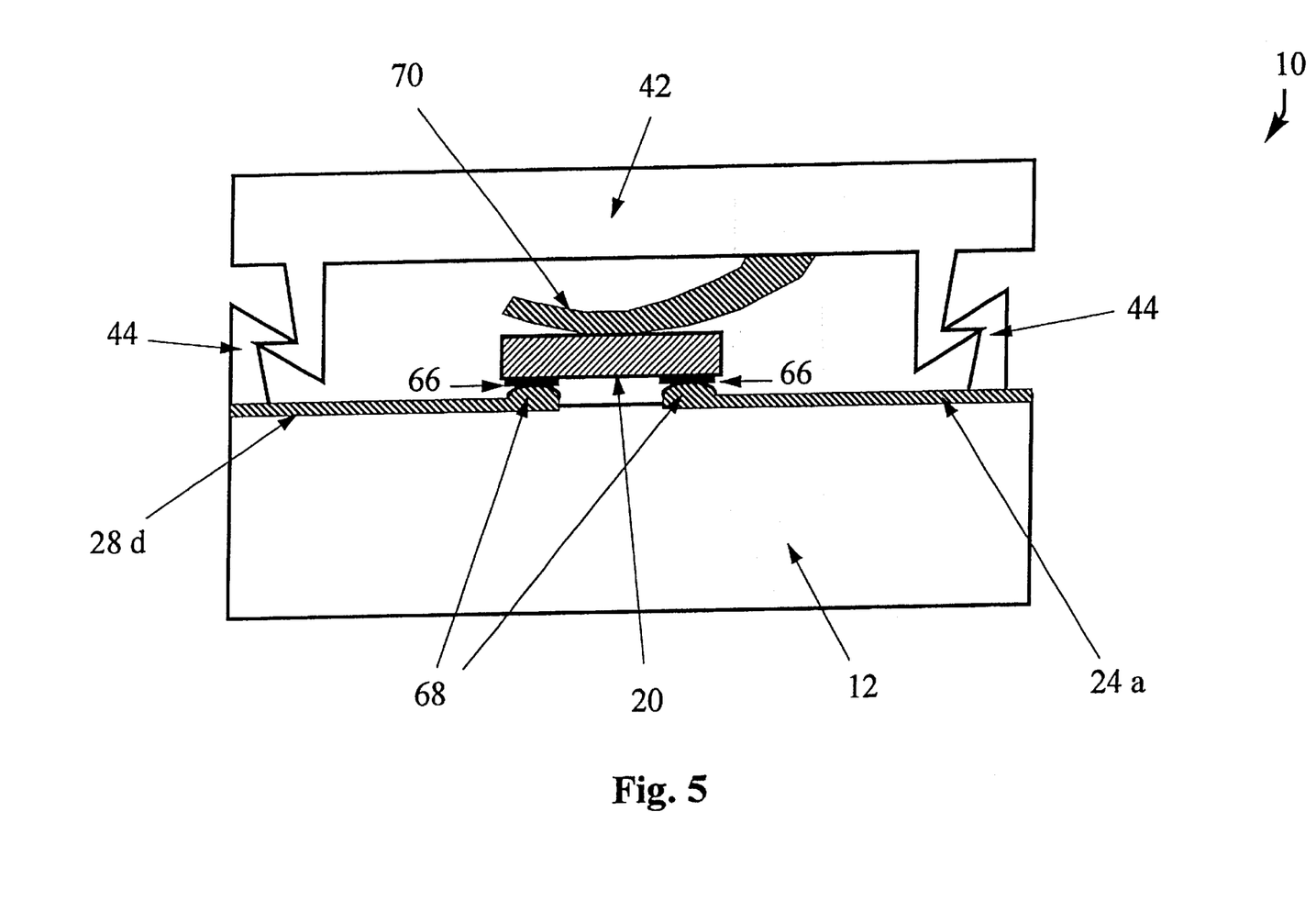
FIG. 5 shows a side view of the electromechanical component with a spring and bumps for contacting an electronic circuit.

Another alternative of fastening the chip is shown in FIG. 5. The chip 20 is here turned over with regard to its orientation in FIG. 4 so that, making reference to FIG. 5, the connecting areas 66 of the bare chip 20 face downwards. These connecting areas 66 are placed onto bumps 68, whereupon the housing cover 42, which is provided with a pressure-exerting spring 70, is attached and pressed towards the polymeric body 12 until the snap connectors 44 snap into place.

Figure 6:
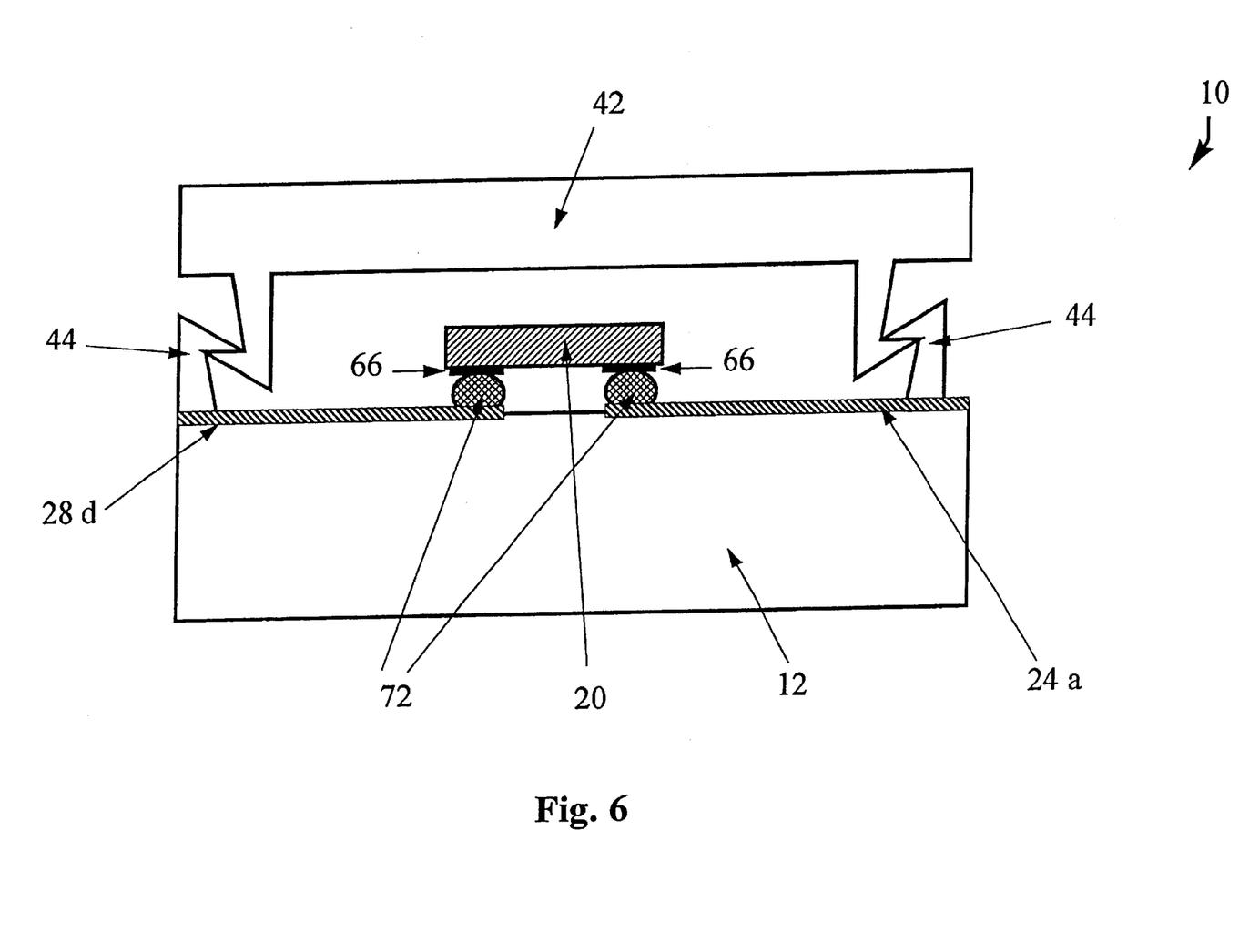
FIG. 6 shows a side view of the electromechanical component with adhesive bumps for contacting an electronic circuit.

FIG. 6, however, shows a further possibility of contacting the chip 20, the chip 20 being here connected by means of adhesive bumps 72. The adhesive forming said adhesive bumps 72 must, of course, be a conductive adhesive. The adhesive bumps can be applied to the polymeric body e.g. by means of the stamping technique, the dispensing technique or by means of a stencil printing technique.

In the electromechanical components according to the present invention, the chip 20 preferably fulfills the known electronic functions for use as an acceleration sensor, a rotary speed sensor, a microvalve, a micropump, a pressure sensor, a force sensor. Functions may e.g. be capacitance reading, temperature compensation and self-test functions.

Figure 7:
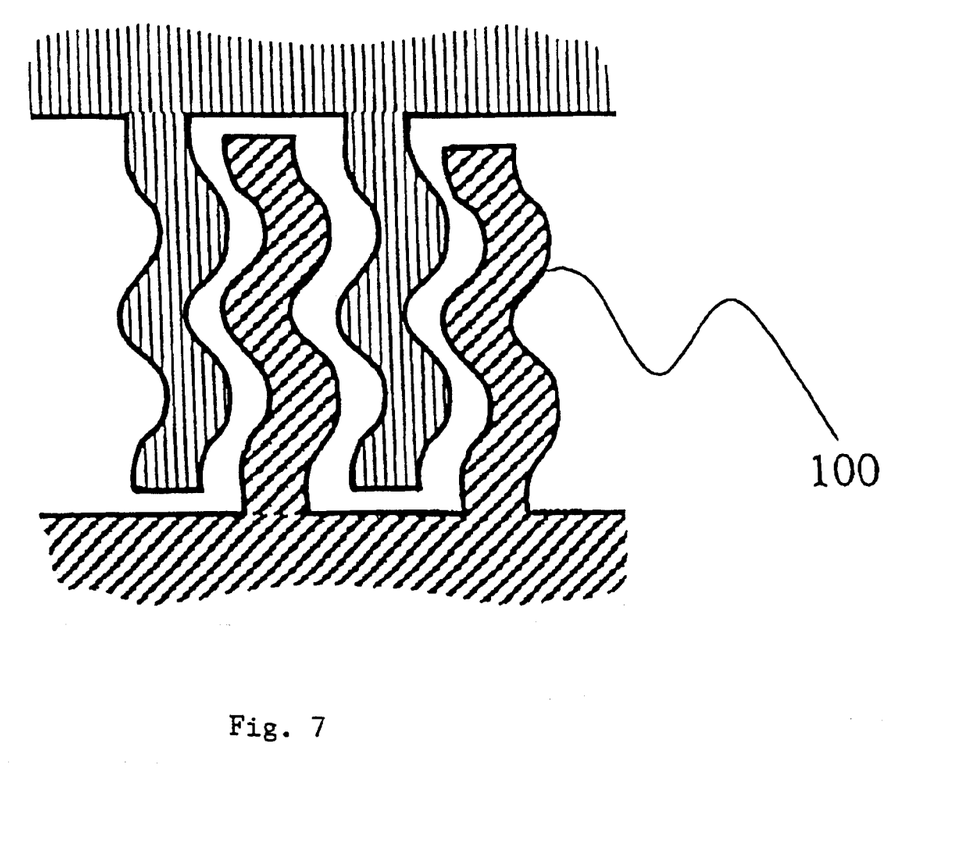
FIG. 7 shows a top view of a detail of the interleaving groups of electrodes according to FIG. 1, the electrode fingers having, however, a wavelike shape.

FIG. 7 shows a top view of a detail of the interleaving electrode groups 100 of FIG. 1, the electrode fingers having, however, a wavelike shape. As can be seen in FIG. 7, the polymeric body is provided with wavelike electrode structures 100 so as to achieve a higher mechanical stability of thin mould walls during injection moulding.

From the statements made hereinbefore, it can be seen that by means of the geometrical design of the active part of the electromechanical component, i.e. in the case of acceleration sensors of the springs and the mass, by the selection of the materials in question and by the optimization of the metal thicknesses, parameters can be achieved similar to those of known airbag sensors made of silicon. This applies especially to the basic capacitance, the sensitivity as a change of capacitance with applied acceleration, the natural frequency and the damping. In view of the fact that the properties of the electromechanical components according to the present invention are similar to those of silicon sensors, it is even possible to use electronic circuits which are, in principle, intended to be used with silicon, or at least circuits which are similar to the already existing circuits. Hence, a completely new design will no longer be necessary on the electronic side.

Summarizing, it can be stated that an electromechanical component according to the present invention comprises movable elements, integrated conducting tracks and areas with metallized surfaces, the electromechanical components of polymer materials being preferably produced with the aid of a two- or a multi-component injection moulding technique and currentless chemical metallization. The essential advantages in comparison with electromechanical components made of silicon are the following ones:

drastically reduced costs due to the simple production;

the polymer bodies can be given an arbitrary shape so as to realize snap connections, pressure-exerting springs, alignment pins, guide holes, anchoring means, sealing means, . . . ;

less sensitivity to contamination and ambient conditions in view of the fact that the size of the components can be adjusted to arbitrary dimensions; and arbitrary three-dimensional shaping instead of the two-dimensional surface treatment known in connection with silicon.

What is claimed, is:

1. An electromechanical component comprising:

a polymeric body including a mechanically active part and a frame; and a metal layer which covers the mechanically active part at least partially so as to mechanically stabilize the same, said mechanically active part including a spring beam connecting the frame to a mass which moves when said spring beam bends; and said metal layer encompassing the spring beam substantially completely, with the exception of the locations where said spring beam is connected to the frame and the mass, so as to mechanically reinforce said spring beam.

2. An electromechanical component according to claim 1, wherein a further metal layer is additionally provided on a mechanically non-active part of the polymeric body, said further metal layer being used for conducting electric signals or for screening off electromagnetic disturbances.

3. An electromechanical component according to one of the preceding claims, wherein the areas of the polymeric body, which have the metal layer and the further metal layer provided thereon, consist of a first polymer material which is adapted to be metallized in a wet-chemical process, and wherein the areas, which do not have a metal layer provided thereon, consist of a second polymer material which is not metallized in a wet-chemical process.

4. An electromechanical component according to claim 3, wherein the polymeric body is provided with anchoring means used for interconnecting at least the mechanically active part consisting of the first polymer material and the part of the polymeric body consisting of the second polymer material such that these parts are in essentially positive engagement with one another.

5. An electromechanical component according to claim 2, wherein the polymeric body is provided with an electrode structure comprising a first group of electrodes on the movable mass and a second group of electrodes on the fixed frame, said first and second groups being arranged in an interleaving mode of arrangement so as to act as a capacitive sensor a movement of the mass, the additional metal layer covering the first group of electrodes as well as the second group of electrodes at least partially, and said additional metal layer being implemented such that the first group of electrodes is electrically insulated from the second group of electrodes by an area of the polymeric body having no metallization.

6. An electromechanical component according to claim 2, wherein the additional metal layer is also provided with a connecting region including contact areas for an electronic circuit, a connecting plug and/or an SMD/soldered connection, said contact areas being electrically insulated from one another.

7. An electromechanical component according to claim 1, wherein the metal layer has a sandwich structure consisting of various metals, and/or is reinforced by electroplating.

8. An electromechanical component according to claim 1, comprising in addition:
a housing base made of polymer; and
a housing cover made of polymer, the polymeric body being arranged between the housing cover and the housing base.

9. An electromechanical component according to claim 8, wherein the polymeric body, the housing cover and the housing base are provided with snap connection means with the aid of which the polymeric body, the housing cover and the housing base are interconnected mechanically and/or electrically.

10. An electromechanical component according to claim 8, wherein alignment means are provided on the housing cover, the housing base and the polymeric body, so as to align the polymeric body with the housing base and the housing cover.

11. An electromechanical component according to claim 8, wherein a sealing means made of polymer is provided so as to encapsulate the electromechanical component, said sealing means being especially a seal which is formed integrally with the housing base, the housing cover and/or the polymeric body by injection moulding, or a separate sealing ring.

12. An electromechanical component according to claim 8, wherein the polymeric body and the housing base are formed integrally with one another.

13. An electromechanical component according to claim 6, comprising in addition:
an electronic circuit for activating and/or evaluating the mechanically active part, the electronic circuit being connected to the contact areas in an electrically conductive manner by bonding wires, by solder means, by a conductive adhesive or by spring force-actuated contacts.

14. An electromechanical component according to claim 8, comprising in addition:
an electronic circuit for activating and/or evaluating the mechanically active part, the electronic circuit being connected to the contact areas by at least one spring contact in an electrically conductive manner, and said spring contact being formed integrally with the housing cover or the housing base and having a metallized area extending from a connecting area of the electric circuit to a contact area on the polymeric body.

15. An electromechanical component according to claim 14, wherein the polymeric body is provided with a recess, the electronic circuit being placed in said recess.

16. An electromechanical component according to claim 1, implemented as an acceleration sensor, a rotary speed sensor, a microvalve, a micropump, a pressure sensor or a force sensor.

17. An electromechanical component according to claim 1, wherein the at least one polymer material is selected from a group comprising Pd-doped LCP, undoped LCP, polyamide 6 and polyamide 66, and wherein the metal layer and the further metal layer consist of copper, nickel, gold or of a combination of these materials.

18. An electromechanical component according to claim 1, wherein the mechanically active part of the polymeric body includes a metal body inserted in the polymer material so as to increase the mass.

19. An electromechanical component according to claim 1, wherein the mechanically active part of the polymeric body is provided with recesses so as to define spacers preventing the mechanically active part from sticking to the frame in the case of movement or contact.

20. A method for producing an electromechanical component comprising the steps of:
forming a polymeric body including a mechanically active part and a frame, said mechanically active part including a spring beam connecting the frame to a mass which moves when said spring beam bends; and forming a metal layer covering the mechanically active part at least partially so as to mechanically stabilize the same, in such a way that the metal layer encompasses the spring beam substantially completely, with the exception of the locations where said spring beam is connected to the frame and the mass, so as to mechanically reinforce said spring beam.

21. A method according to claim 20, wherein the step of forming the metal layer comprises vapour-phase coating making use of a shadow mask.

22. A method according to claim 20, wherein the step of forming the polymeric body comprises the following steps in an arbitrary sequence:
injection moulding a first portion of the polymeric body which is to be metallized, making use of a first polymer material which is adapted to be metallized in a wet-chemical process;
injection moulding a second portion of the polymeric body (which is not to be metallized, making use of a second polymer material which is not adapted to be metallized in a wet-chemical process; and
wherein the metallizing step comprises the step of
metallization in a wet-chemical process in such a way that only the surfaces of the polymeric body consisting of the first polymer material are provided with a metal layer.

23. A method according to claim 22, wherein the step of forming the metal layer additionally comprises:
reinforcing the wet-chemically produced metal layer by electroplating.

24. A method according to claim 23, wherein the reinforcement by electroplating comprises:
fixing the mechanically active part of the polymeric body to the frame of the polymeric body making use of an auxiliary structure;
applying a potential to a fixed part of the polymeric body;
depositing a metal on the movable part and the mechanically active part; and,
after the step of reinforcing the metal layer by electroplating, removing the auxiliary structure.

25. A method according to claim 20, comprising the steps of
  forming the polymeric body such that it is provided with snap connections;
  injection moulding in addition a polymer cover and a polymer base which are equipped with snap connections as well; and
  pressing the polymeric body, the polymer cover and the housing base together until the snap connections have snapped into place.

26. A method according to claim 25, wherein the polymeric body is not provided with any snap connections and wherein the polymer cover and the polymer base are interconnected by ultrasonic welding or laser welding.

27. A method according to claim 20, wherein also the housing base is formed during the step of forming the polymeric body so that the polymeric body and the housing base are formed integrally with one another.

28. A method according to claim 20, wherein the step of forming comprises the following steps:
  injection embossing (injection stamping) or hot embossing (hot stamping) a polymer starting material so as to obtain an embossed element (stamped element) including the mechanically active part as well as geometrically fine structures of the frame; and
  encompassing the embossed element with polymer material by means of injection moulding so as to obtain the polymeric body.

29. A method according to claim 20, wherein the step of forming comprises the following steps:
  injection moulding an initial body of polymer material;
  injection embossing or hot embossing said initial body of polymer material so as to obtain the polymeric body in such a way that the mechanically active part as well as geometrically fine structures of the frame are defined by injection embossing or hot embossing; and
  encompassing the embossed element with polymer material by means of injection moulding so as to obtain the polymeric body.

30. A method according to claim 20, comprising in addition the following step:
  equipping the electromechanical component with an electronic circuit by glueing making use of a conductive adhesive, by wire bonding, by soldering or by constant application of a mechanical pressure to the electronic circuit, so as to guarantee a mechanical as well as an electrical connection between the polymeric body and the electronic circuit.

31. A method according to claim 22, wherein the following steps are carried out prior to the metallization:
  cleaning the polymeric body;
  tempering the polymeric body; and
  sensitizing the surface of the polymeric body.

32. A method according to claim 31, wherein the step of sensitizing the surface is caused by a surface reaction comprising mild etching of the surface or causing the surface to swell or subjecting the surface to a plasma treatment and seeding it with suitable seeds so as to obtain a metallization.

33. A method according to claim 20, wherein the step of forming the polymeric body comprises the following steps:
  providing a metal body;
  encompassing said metal body with polymer material by injection moulding so as to form the polymeric body in such a way that the mechanically active part of the polymeric body includes the metal body.

34. A method according to claim 20, wherein an electrode structure is defined by the metal layer, the capacitance of said electrode structure being increased by reinforcing the metal layer thickness and by the resultant change in the electrode distance.

35. A method according to claim 20, wherein the step of forming the polymeric body includes the following step:
  forming recesses on the mechanically active part or on the frame so as to define spacers preventing the mechanically active part from sticking to the frame in the case of movement or contact.

36. A method according to claim 20, wherein the polymeric body is provided with electrode structures having a wavelike shape so as to achieve a higher mechanical stability of thin mould walls during injection moulding.

* * * * *